United States Patent [19]

Gilbert

[11] Patent Number: 4,929,909
[45] Date of Patent: May 29, 1990

[54] DIFFERENTIAL AMPLIFIER WITH GAIN COMPENSATION

[75] Inventor: Barrie Gilbert, Beaverton, Oreg.

[73] Assignee: Analog Devices, Inc., Norwood, Mass.

[21] Appl. No.: 328,946

[22] Filed: Mar. 27, 1989

[51] Int. Cl.$^5$ .............................................. H03F 3/45
[52] U.S. Cl. ..................................... 330/256; 330/261
[58] Field of Search ........................ 330/256, 261, 289

[56] References Cited

U.S. PATENT DOCUMENTS

| | | | |
|---|---|---|---|
| 4,238,738 | 12/1980 | Komori | 330/256 |
| 4,274,061 | 6/1981 | Kraemer | 330/289 X |
| 4,323,854 | 4/1982 | Hester | 330/256 |
| 4,604,586 | 8/1986 | Rinderle | 330/256 X |
| 4,724,337 | 2/1988 | Maeda et al. | 330/256 X |

FOREIGN PATENT DOCUMENTS

| | | | |
|---|---|---|---|
| 64126 | 11/1982 | European Pat. Off. | 330/261 |
| 2067374 | 7/1981 | United Kingdom | 330/261 |

Primary Examiner—James B. Mullins
Attorney, Agent, or Firm—Wolf, Greenfield & Sacks

[57] ABSTRACT

A differential amplifier including circuit means for generating a tail current which is not only porportional to absolute temperature, but also is adjusted to compensate for the non-ideal transistor geometries and properties, including finite beta and non-zero, temperature-dependent intrinsic resistances, so as to result in an amplification ratio which is substantially independent of all component variations.

10 Claims, 2 Drawing Sheets

DIFFERENTIAL AMPLIFIER WITH GAIN COMPENSATION

FIELD OF THE INVENTION

This invention relates to differential amplifier circuits, and, more particularly, gain-compensated differential amplifier circuits.

BACKGROUND OF THE INVENTION

The differential amplifier is a very common circuit configuration used to amplify the difference voltage between two input signals. In the ideal case, the output is entirely independent of the individual signal voltages and is dependent only on their difference. Differential amplifiers are widely used in applications where weak signals are to be amplified, particularly weak signals which may be contaminated by common-mode noise. They are universally used in operational amplifiers and are very important in DC amplifier design. Referring to FIG. 1, a schematic circuit diagram is shown for a classic bipolar transistor differential amplifier 10, or "long-tail pair", having a single-ended output.

The differential gain, G, of a differential amplifier and its temperature stability, dG/dT, are typically parameters of great significance in its design and use. The differential mode gain G for the circuit of FIG. 1, taking into account finite current gain (beta) and finite emitter and base resistances for transistors 12 and 14 (which are assumed to be matched), is given by the equation $$G = R_c / 2(r + r_e),$$

where $R_c$ is the resistance of the collector load resistor 13; $r_e$ is the intrinsic "electronic" emitter resistance, $kT/qI$, of each of the transistors 14 and 12, where k is Boltzmann's constant, T is the absolute temperature, q is electronic charge, and I is half of the tail current in the lead 18; and r is the total ohmic emitter resistance, $r = r_{ee'} + r_{bb'}/(\text{beta})$, $r_{ee'}$ being the emitter resistance, $r_{bb'}$ being the base resistance and (beta) being the current gain of each transistor.

Many temperature-dependent factors appear in the foregoing equation. The intrinsic emitter resistance obviously is a function of temperature and perfect stabilization of that quantity requires that the tail current be proportional to absolute temperature (PTAT). The base resistance is very temperature-dependent. The ohmic emitter resistance is also temperature-dependent to a lesser degree. Further, these resistance values are very geometry sensitive and can, with $R_c$ and beta, vary from wafer to wafer (and lot to lot) in the fabrication process.

Accordingly, it is an object of the present invention to provide a differential amplifier with improved temperature stability of gain.

Yet another object of the invention is to provide a differential amplifier in which temperature stabilization and gain uncertainty is minimized from lot to lot in the fabrication process.

SUMMARY OF THE INVENTION

The foregoing and other objects of the invention are achieved in a differential amplifier including tail current generator means for providing a tail current which is PTAT and which includes a component of current which compensates for the ohmic resistances of the transistors and finite beta. This latter component of current is a function of the transistor geometries and therefore compensates automatically for lot-to-lot variations. The tail current generator means includes a current source biased by a $\Delta V_{BE}$ cell which employs device geometries related to those of the transistors in the long-tail pair.

The invention will be more fully understood from the following detailed description, which should be read in conjunction with the accompanying drawing, in which like numerals are used to identify like elements.

DETAILED DESCRIPTION

Figure 1:
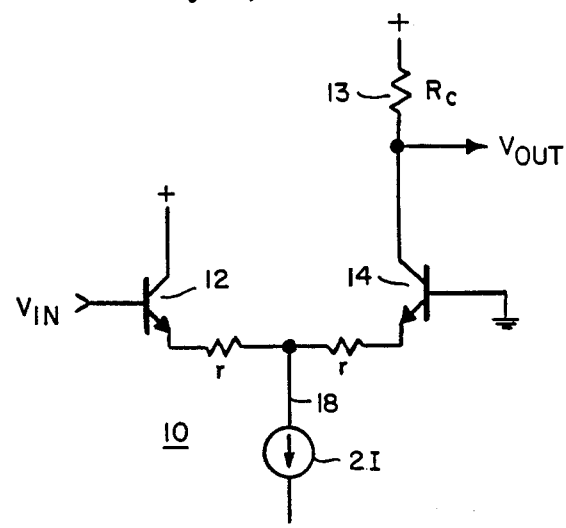
FIG. 1 is a schematic circuit diagram of a basic differential amplifier circuit according to the prior art.

In the circuit of FIG. 1, the ideal small signal differential voltage gain (assuming infinite beta transistors and negligible base and emitter resistances) is $R_c/2r_e$. Thus, the actual gain differs from the ideal gain by the factor $1/(1 + r/r_e)$. Using typical values such as $r = 2.5$ ohms and $r_e = 26$ ohms, the small signal gain error, due to the assumption that $r << r_e$, is about 10 percent. Since $r_e$ is a function of the tail current, an expression can be derived for setting the tail current to a value which will restore the gain to the idealized value. This expression is $$2I = 2GV_t/Rc(1 - 2Gr/Rc) \tag{18}$$

where G is the desired gain and $V_T$ is the thermal voltage, $kT/q$. If r were known, it would be a simple matter to raise the tail current by the appropriate factor. However, this ohmic resistance is not easy to measure and, in any event, it varies significantly from one production lot to the next. A design is needed, therefore, which is self-compensating.

Figure 2:
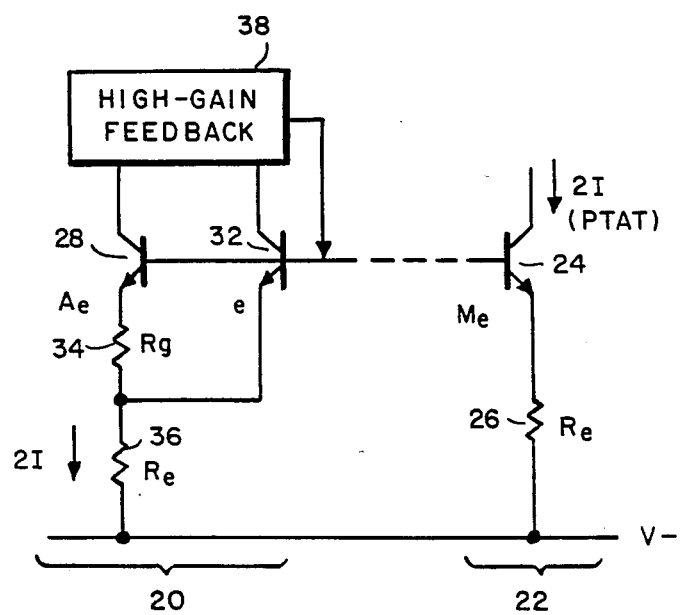
FIG. 2 is a simplified schematic circuit diagram of a tail current generator according to the present invention, for use with a differential amplifier to achieve temperature-stable gain.

A first consideration in the design of a gain-stable, temperature-compensated long-tail pair is the requirement that the tail current be PTAT in order to make the intrinsic emitter resistance constant. For this purpose, the $\Delta V_{BE}$ cell 20 of FIG. 2 is used to bais a current source 22 for generating the tail current, 2I. The use of a $\Delta V_{BE}$ cell as means to generate a tail current which is PTAT is well documented in the literature, as prior art. The current source comprises a common-emitter NPN transistor 24 having an emitter resistor 26, of resistance $R_e$, connected to the negative supply (or ground, if a single-sided supply is used). The $\Delta V_{BE}$ cell 20 is formed by a pair of transistors 28 and 32, a first emitter resistor 34 and a second emitter resistor 36. Transistor 32 has a unit-area emitter, transistor 28 has an emitter area of A units, and transistor 24 has an emitter area of M units. Transistors 28 and 32 are driven to equal current densities by a high-gain feedback circuit 38, which forces an appropriate base voltage. Under the assumption that the differential amplifier is an ideal amplifier, half of the tail current is given by the formula $$I = \frac{V_T}{R_g} \ln(A)$$

If the ohmic emitter resistances are included, though, and the assumption is made that the smaller transistor, transistor 32, has an emitter resistance r and the larger device, transistor 28, emitter resistance r/A, then the equation for I becomes $$I = \frac{[V_T \ln(A)]/R_g}{1 - (r/R_g)(1 - 1/A)} \quad (40)$$

The denominator of equation 40 will readily be seen to have the same form as that of equation 18; it will further be seen that algebraic manipulation yields the equation $$\frac{2Gr}{R_c} = \frac{r(1 - 1/A)}{R_g} \quad (41)$$

The area ratio A may be chosen to suit the $V_{BE}$ requirements, but is usually much greater than unity, so the term $(1-1/A)$ is not very dependent on A. Since r appears on both sides of the equation, it may be eliminated. Rearranging shows that the primary control is in the ratio $R_g/R_c$:

$$\frac{R_g}{R_c} = \frac{(1 - 1/A)}{2G} \quad (42)$$

Thus in theory, once G, A, and $R_c$ are chosen, $R_g$ can be selected to achieve compensation.

Most of the long-tail pair transistors' internal resistance arises in $R_{bb'}$, in the bases; $R_{ee'}$ is usually much less significant. $R_{bb'}$ is not only troublesome because of its effect on the gain of the long-tail pair (since it appears as $R_{bb'}/\text{beta}$ in the emitter circuit, and is often comparable to the electronic $r_e$), but also because it introduces noise. $R_{bb'}$ also has an impact on the bandwidth; the higher $R_{bb'}$, the lower the amplifier bandwidth. Minimization of $R_{bb'}$ is thus desirable. To minimize $R_{bb'}$, the transistor geometry should have narrow emitter stripes and base contacts spaced as closely as possible to the emitter edge. A nominal value of $R_{bb'}$ for such a transistor, for example, may be about 57 ohms. However, $R_{bb'}$ may well be subject to a large tolerance. For example, a design nominally intended to yield 57 ohms could produce an $R_{bb'}$ equal to 80 ohms. If the long-tail pair is designed to have a nominal 10 dB gain and the transistors have a minimum beta of 65, then even with negligible $R_{ee'}$, the actual gain may be as low as 9.54 dB, which is a considerable deviation from the designed gain. Trimming could restore this gain to the desired value, but only at a specific temperature as $R_{bb'}$ is very temperature-dependent. Hence it is desirable to compensate for the base-defect error in a more exact way, which tracks with temperature.

Use of the $\Delta V_{BE}$ cell makes this possible. The operation of a $\Delta V_{BE}$ cell as means to generate a tail current which is PTAT is well documented in the literature, as prior art. However, this invention shows how, with proper design, this $\Delta V_{BE}$ cell can be used to bias the current source (i.e., transistor 24 and emitter resistor 26) to a point which adds to the tail current a component keyed to and tracking the ohmic resistances associated with the device geometries.

Figure 3:
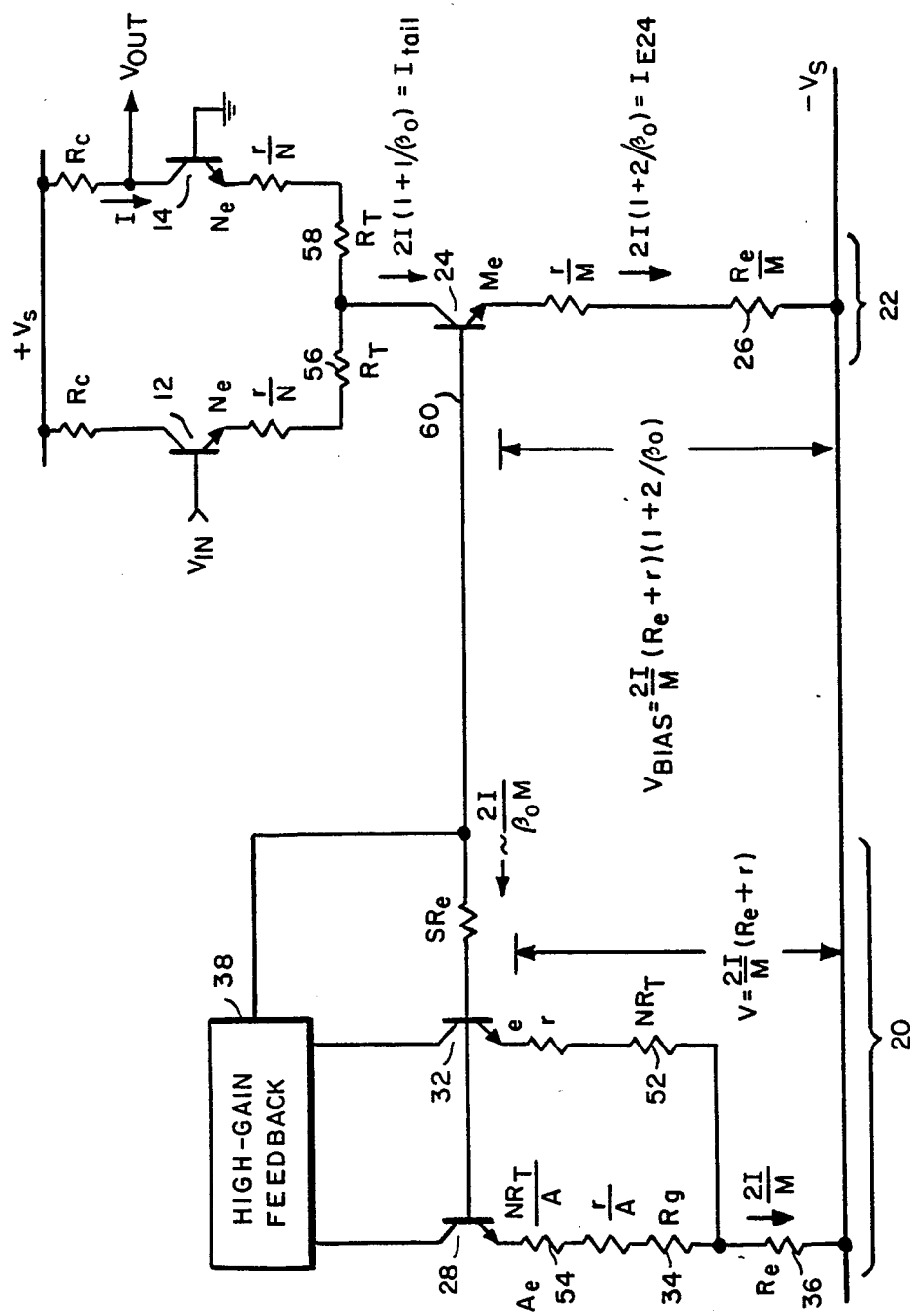
FIG. 3 is a detailed schematic circuit diagram of a gain-compensated differential amplifier according to the present invention.

In the discussion of FIG. 2 above, a somewhat simplified analysis was used, assuming, among other things, that series emitter resistors were not used in the long-tail pair and that only intrinsic emitter resistances need be considered. The present invention has greatest utility when series emitter resistors in the long-tail are small (relative to the electronic emitter resistances of the transistors) or are not used, of course, but use of such resistors is not uncommon. The analysis also failed to consider a number of other sources of error. A more rigorous, more generalized circuit model is shown in FIG. 3, which depicts a complete resistance-corrected, gain-compensated differential amplifier according to the invention, with all emitter-related ohmic resistances shown explicitly.

Transistor 32 is assumed to have a unit area emitter geometry, with intrinsic emitter resistance r and series emitter resistor 52 (of resistance $NR_T$. The other $\Delta V_{BE}$ cell transistor 28 has emitter area of A units, intrinsic emitter resistance r/A, series resistors 54 (of resistance $NR_T/A$) and 34 (of resistance $R_g$). Transistors 28 and 32 operate at the same current density, although different collector currents. The long-tail pair transistors 12 and 14 have N-unit emitter areas, intrinsic emitter resistance r/N and, for generality, series emitter resistors 56 and 58 of resistance $R_T$. The current-source transistor 24 has emitter area of M units, intrinsic emitter resistance r/M and a series emitter resistor 26 of resistance $R_e/M$. The quiescent collector current for each of the differential amplifier transistors 12 and 14 is intended to be a constant value, I, over some temperature range of interest. As will be seen, this is provided by establishing an appropriate bias voltage on bias line 60 to the base of transistor 24.

The transconductance of the long-tail pair, and thus its gain, actually is a function of the collector current, not the tail current. Thus, to set the collector current to the desired value, an increase must be made to the tail current to compensate for finite B. Consequently, the tail current $I_{tail}$ (i.e., $I_{tail} = 2I$, as shown in FIG. 1 and FIG. 2), which is also the collector current of transistor 24, must be $2I(1+1/\text{beta})$. Further, there is a difference between the emitter current $I_{E24}$ of current source transistor 24 and the tail current $I_{tail}$ of the long-tail pair. Each of these B-compensation factors amounts to about 1% gain error, with an associated temperature drift of typically 100 ppm/° C. To correctly compensate for this total error, the voltage applied to bias line 60 has to produce across the series combination of emitter resistor 26 and intrinsic emitter resistance r/M a voltage adequate to cause the emitter current in transistor 24, $I_{E24}$, to be $(1+1/\text{beta})$ times the tail current, or to a first order approximation $(1+2/\text{beta})$ times the total collector current, 2I. Additionally, the long-tail pair may (and normally would be) driven by an emitter follower on each input (not shown). The differential output resistance of the emitter followers typically introduces another "one-alpha" error for which similar compensation may be provided; in such a situation, the emitter current $I_{E24}$ should be $2I(1+3/\text{beta})$, since second-order terms can be ignored.

A high-gain feedback circuit 38 between the collectors of transistors 28, 32 and the base of transistor 24 drives transistor 32 via a resistance $SR_e$, where S is a factor chosen to eliminate the beta-dependence in the system.

The operation of the $\Delta V_{BE}$ cell 20 is well documented in the literature. It provides on line 60 a drive voltage $V_{bias}$ which produces PTAT. Assuming the various transistors have reasonably matched current gains, the tail current is thus both PTAT and adjusted (i.e., set to an appropriate level) to account for the characteristics (particularly beta) of the transistors in the differential amplifier and the intrinsic emitter resistance of the current source.

Having thus described the inventive concept and an embodiment of the invention, various modifications, alterations and improvements will readily occur to those skilled in the art. Such modifications, alterations and improvements are intended to be suggested though not expressly discussed, as the foregoing detailed description is offered by way of example only and is not intended to be limiting. The invention is limited only by the following claims and equivalents thereto.

What is claimed is:

1. A gain-compensated differential amplifier circuit comprising:
   (a) a transistor differential amplifier, with reasonably matched current gains, operating at a tail current $I_{tail}$;
   (b) a transistor current source responsive to a control voltage for generating said tail current as a function of the control voltage;
   (c) control voltage generating means for generating, as the control voltage, a voltage which varies proportionately to absolute temperature; and
   (d) the control voltage generating means including means for functionally relating the control voltage to the intrinsic emitter resistance of the current source.

2. The amplifier of claim 1 wherein the control voltage generating means is adapted to generate, as the control voltage, a voltage which generates a tail current having a component that is functionally related to and tracks the ohmic resistances associated with the geometries and current gain characteristics of the differential amplifier transistors and the transistor current source.

3. The amplifier of either claim 1 or claim 2 wherein the current source comprises a common-emitter transistor whose collector is connected to receive the emitter currents of the transistors of the differential amplifier and the control voltage generating means includes a $\Delta V_{BE}$ cell for supplying to the base of the common-emitter transistor a control voltage which produces in the collector of the common-emitter transistor a current which is a function of the current gain of the differential amplifier transistors.

4. The amplifier of claim 3 wherein the control voltage produces in the emitter of the common-emitter transistor a current $2I(1+2/\text{beta})$ and a tail current of $2I(1+1/\text{beta})$, where beta is the current gain of the differential amplifier transistors, over a selected temperature range.

5. The amplifier of claim 3 wherein the current source further includes an emitter resistor connected between the emitter of the common-emitter transistor and a voltage reference, and wherein the differential amplifier transistors have finite intrinsic emitter resistance and the control voltage is a function of the emitter resistance, the finite intrinsic emitter resistance of the common-emitter transistor and the current gains of the differential amplifier transistors.

6. A gain-compensated differential amplifier circuit comprising:
   (a) a transistor differential amplifier, with reasonably matched current gains, operating at a tail current $I_{tail}$;
   (b) a current source responsive to a control voltage for generating said tail current as a function of the control voltage;
   (c) control voltage generating means for generating, as the control voltage, a voltage which varies proportionately to absolute temperature, and which is provided by a $\Delta V_{BE}$ cell; and
   (d) the $\Delta V_{BE}$ cell including means for functionally relating the control voltage to the intrinsic emitter resistance of the current source.

7. The amplifer of claim 6 wherein the control voltage generating means is adapted to generate, as the control voltage, a voltage which generates a tail current having a component that is functionally related to and tracks the resistances associated with the transistor geometries and current gain characteristics of the transistors of the differential amplifier and the current source.

8. The amplifier of either claim 6 or claim 7 wherein the current source comprises a common-emitter transistor whose collector is connected to receive the emitter currents of the transistors of the differential amplifier and the $\Delta V_{BE}$ cell supplies to the base of the common-emitter transistor a control voltage which produces in the collector of the common-emitter transistor a current which is a function of the current gain of the differential amplifier transistors.

9. The amplifier of claim 8 wherein the control voltage produces in the emitter of the common-emitter transistor a current $2I(1+2/\text{beta})$ and a tail current of $2I(1+1/\text{beta})$, where beta is the current gain of the differential amplifier transistors, over a selected temperature range.

10. The amplifier of claim 8 wherein the current source further includes an emitter resistor connected between the emitter of the common-emitter transistor and a voltage reference, and wherein the differential amplifier transistors have finite intrinsic emitter resistance and the control voltage is a function of the emitter resistance, the finite intrinsic emitter resistance of the common-emitter transistor and the current gains of the differential amplifier transistors.

* * * * *